(12) United States Patent
Varnavas et al.

(10) Patent No.: US 8,769,387 B1
(45) Date of Patent: Jul. 1, 2014

(54) SYSTEM FOR CONFIGURING MODULAR TELEMETRY TRANSPONDERS

(75) Inventors: Kosta A. Varnavas, Madison, AL (US); William Herbert Sims, III, New Market, AL (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 146 days.

(21) Appl. No.: 13/424,754

(22) Filed: Mar. 20, 2012

(51) Int. Cl.
 *H03M 13/00* (2006.01)
(52) U.S. Cl.
 USPC ................................ 714/784; 701/3; 342/352
(58) Field of Classification Search
 CPC .......... H03M 13/1515; H03M 13/151; H03M 13/1545; H03M 13/158; H03M 13/15
 See application file for complete search history.

(56) References Cited

U.S. PATENT DOCUMENTS

| | | | | |
|---|---|---|---|---|
| 5,699,365 A * | 12/1997 | Klayman et al. | ............... | 714/708 |
| 6,038,679 A * | 3/2000 | Hanson | .......................... | 714/5.1 |
| 6,400,728 B1 * | 6/2002 | Ott | ................................ | 370/465 |
| 7,210,077 B2 * | 4/2007 | Brandenberger et al. | ..... | 714/708 |
| 2003/0133423 A1 * | 7/2003 | LaDue | .......................... | 370/330 |
| 2005/0100102 A1 * | 5/2005 | Gazdzinski et al. | .......... | 375/242 |

* cited by examiner

*Primary Examiner* — Albert Decady
*Assistant Examiner* — Enamul M Kabir
(74) *Attorney, Agent, or Firm* — Absolute Technology Law Group, LLC; James J. McGroary

(57) ABSTRACT

A system for configuring telemetry transponder cards uses a database of error checking protocol data structures, each containing data to implement at least one CCSDS protocol algorithm. Using a user interface, a user selects at least one telemetry specific error checking protocol from the database. A compiler configures an FPGA with the data from the data structures to implement the error checking protocol.

21 Claims, 1 Drawing Sheet

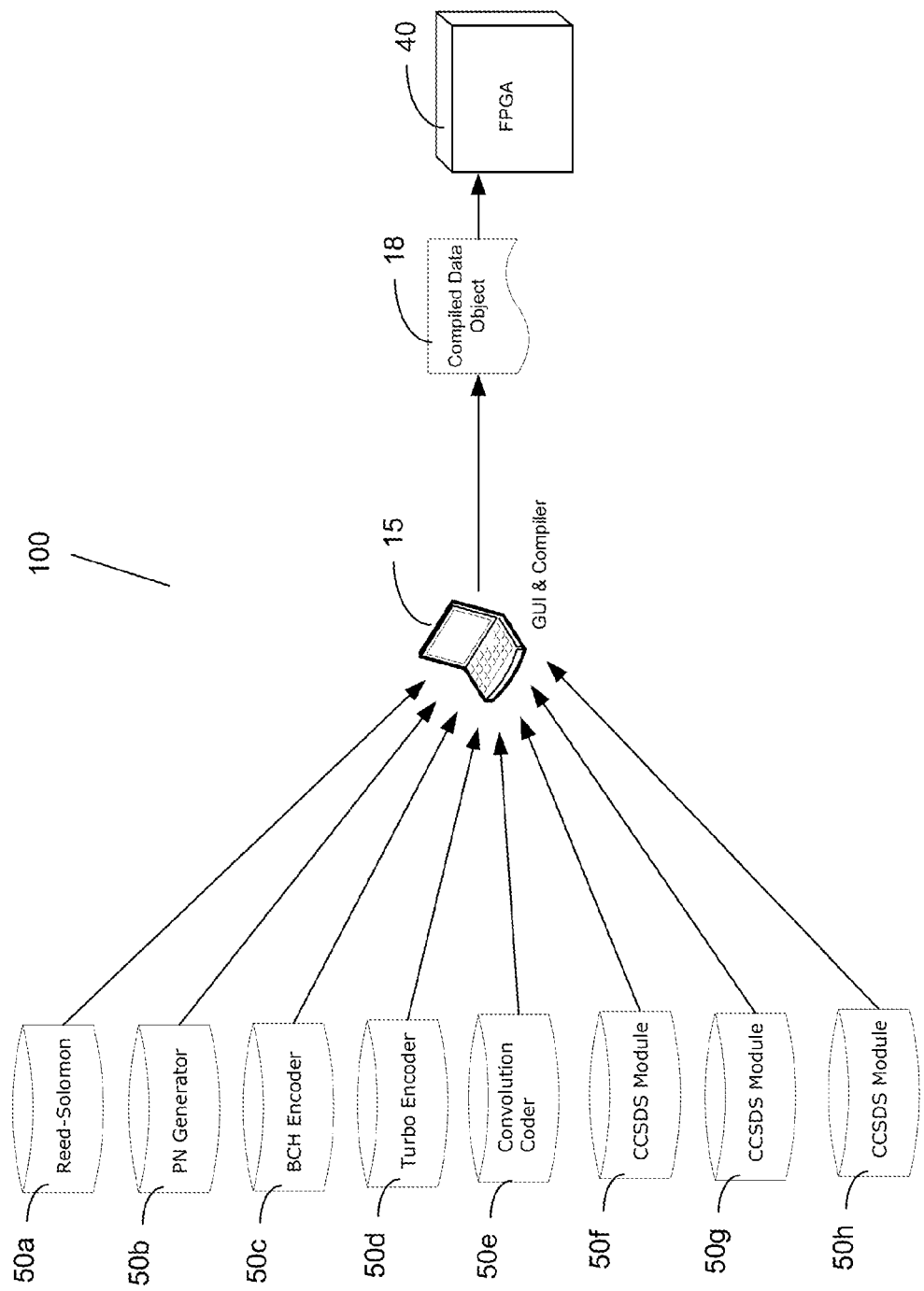

US 8,769,387 B1

SYSTEM FOR CONFIGURING MODULAR TELEMETRY TRANSPONDERS

FEDERAL RESEARCH STATEMENT

The invention described herein was made by employees of the United States Government and may be manufactured and used by or for the Government of the United States of America for governmental purposes without the payment of any royalties thereon or therefore.

CROSS REFERENCE

This application is related to U.S. application Ser. No. 13/369,704, entitled "Adaptable Transponder for Multiple Telemetry Systems" and filed on Feb. 9, 2012, which is hereby incorporated by reference in its entirety.

FIELD OF INVENTION

Present invention is a computer system configured with software and data necessary to create custom telemetry transponder cards.

BRIEF DESCRIPTION OF THE DRAWINGS

FIG. 1 illustrates an exemplary embodiment of a computer system for configuring modular telemetry transponders.

TERMS OF ART

As used herein, the term "BCH error-checking protocol" means a CCSDS protocol that incorporates the BCH multi-level cyclic variable-length digital error-correcting code used to correct multiple random error patterns or any algorithmic and functional equivalent or derivative of this protocol.

As used herein, the term "CCSDS" means the Consultative Committee for Space Data Systems, which promulgates standards for software used in space systems, including, but not limited to BCH error-checking protocol, Reed-Solomon protocol, pseudo-randomization protocol, Low Density Parity Check (LDPC), Forward Error Correcting and Convolutional Encoding.

As used herein, the term "Field Programmable Gate Array" or "FPGA" means an integrated circuit that can be programmed after manufacturing to perform the functions of an ASIC.

As used herein, the term "pseudo-randomization protocol" or "PN generator" means a CCSDS protocol that synchronizes data by using a deterministic procedure that produces random numbers within definable limits or any algorithmic and functional equivalent or derivative of this protocol known in the art.

As used herein, the term "Reed-Solomon protocol" means a CCSDS protocol that incorporates the non-binary cyclic error-correcting codes, or any algorithmic and functional equivalent or derivative of this Reed-Solomon protocol known in the art. Reed-Solomon codes are one type of BCH codes.

As used herein, the term "software defined radio" or "SDR" means a radio communications system where components that have been typically implemented in hardware (such as mixers, filters, amplifiers, modulators/demodulators, and detectors) are instead implemented by means of software on an embedded computing device.

As used herein, the term "telemetry application data object" means a telemetry specific entity that can be manipulated by the commands of a programming language such as value, variable, function, or data structure.

As used herein, the term "telemetry card" refers to a device configured with circuitry to perform telemetry encoding communications, command decoding communications as well as other SDR component functions.

As used herein, the term "telemetry specific" means conforming to the specifications necessary to interface with a specific on board flight computer. Such examples include the Forward Error Correcting (LDPC, Reed-Solomon, convolutional) codes, command synchronization with error detection, and increased spectral efficiency techniques.

As used herein, the term "turbo code" means any code in the class of high-performance forward error-correction codes that are used in satellite communications and other applications where designers seek to achieve reliable information transfer in the presence of data-corrupting noise.

As used herein, the term "Viterbi algorithm" means the algorithm first conceived by Andrew Viterbi for decoding convolutional codes over digital communication links for encryption and auto-ranging.

BACKGROUND

Telemetry refers to technology used by a satellite to transmit data to a monitoring station. Transponders, important devices in telemetry that receive signals and transmit the signals at different frequencies, still rely on technology dating back to the 1960s.

Every telemetry transponder is configured to interface with specific on board flight computer hardware, and to perform specific error checking protocols. With the associated hardware necessary for the satellite to comply with the transponder, a typical NASA telemetry system costs $5 to $10 million dollars per satellite.

Related U.S. patent application Ser. No. 13/369,704 discloses a modular telemetry system which can be rapidly deployed utilizing a modularly configured transponder which because it implements field programmable gate array (FPGA) and satellite defined radio (SDR) design principles.

The transponder disclosed in U.S. patent application Ser. No. 13/369,704 is adaptable for all telemetry systems and telemetry communication needs that could be used for NASA missions (including lunar missions and missions to Mars), military intelligence, climate change studies, and emergency services such as fire, ambulance, and police services.

There is an unmet need for a computer system which allows a user to efficiently reprogram transponder devices utilizing the principles of modular transponder design disclosed in U.S. patent application Ser. No. 13/369,704.

There is a need for a computer system specifically adapted to receive user selections and input regarding specific telemetry applications and which can access and compile code necessary to create custom telemetry cards.

There is a further need for a system which can create telemetry cards using principles disclosed in U.S. patent application Ser. No. 13/369,704 to efficiently configure telemetry transponders.

This is a further need for a system which can be adapted to incorporate future developments and efficiencies with respect to telemetry card design and configuration.

SUMMARY OF THE INVENTION

The present invention is a computer system capable of reprogramming telemetry cards for application specific error checking. The system is comprised of a server and database containing a library of CCSDS protocol algorithms. The system further includes a user interface which allows a user to select at least one error checking protocol and a compiler which creates a compiled data object containing data for configuring at least one FPGA. The present invention allows a user to configure a telemetry card with a specific error checking or CCSDS protocol code as needed.

DETAILED DESCRIPTION OF INVENTION

For the purpose of promoting an understanding of the present invention, references are made in the text to exemplary embodiments of system for configuring modular telemetry transponders, only some of which are described herein. It should be understood that no limitations on the scope of the invention are intended by describing these exemplary embodiments. One of ordinary skill in the art will readily appreciate that alternate but functionally equivalent components, materials, and placement may be used. The inclusion of additional elements may be deemed readily apparent and obvious to one of ordinary skill in the art. Specific elements disclosed herein are not to be interpreted as limiting, but rather as a basis for the claims and as a representative basis for teaching one of ordinary skill in the art to employ the present invention.

It should be understood that the drawing is not necessarily to scale; instead, emphasis has been placed upon illustrating the principles of the invention Moreover, the terms "substantially" or "approximately" as used herein may be applied to modify any quantitative representation that could permissibly vary without resulting in a change in the basic function to which it is related.

FIG. 1 illustrates an exemplary embodiment of system for configuring and/or reconfiguring a modular transponder 100. In the embodiment shown, system 100 includes a plurality of predetermined error checking protocols and various other CCSDS protocols in a database on a server. In the embodiment shown, Reed-Solomon 50a, PN generator 50b, BCH encoder 50c, turbo encoder 50d, convolution coder 50e, and various other CCSDS modules 50f-50h are exemplary embodiments of predetermined error checking algorithms which may be programmed onto FPGA 40. In other embodiments, the database of predetermined error checking algorithms may include Viterbi, encryption, auto-ranging, other versions of the BCH error-correcting protocol or any other CCSDS compliant protocols.

Graphical user interface (GUI) 15 allows a user to choose a specific protocol or code from a database of predetermined algorithms and convert them to compiled data object 18 to be programmed onto FPGA 40. This allows a user to choose an appropriate protocol for a specific telemetry application and configure it onto the FPGA of a telemetry card using off-the-shelf FPGA program software to embed the SDR IP to perform specific objectives such as Forward Error Correcting, error detection, bit synchronization, etc.

In the exemplary embodiment described above, a typical user interface may be Microsemi Corpration's Libero software package that allows the SDR IP to be designed, compiled, optimized and incorporated into an FPGA. However, various other embodiments may use other software to design, compile and display protocols to be incorporated in the FPGA.

What is claimed is:

1. A system for configuring at least one reprogrammable telemetry card consisting of:

a plurality of non-uniform satellite telemetry systems, wherein each of said plurality of non-uniform satellite telemetry systems is an on-board satellite telemetry system;

a single reprogrammable telemetry card which is configured with a plurality of software defined radio components common to all of said plurality of non-uniform satellite telemetry systems, wherein said plurality of software defined radio components is re-usable with each of said plurality of non-uniform satellite telemetry systems without modification, wherein said single reprogrammable telemetry card is further configured with an FPGA which may be programmed with a specific error checking protocol which corresponds to a telemetry error checking protocol applicable to at least one specific telemetry system of said plurality of non-uniform telemetry systems; and a user interface configured to display a list of satellite telemetry system types, wherein each satellite telemetry system type corresponds to said specific error checking protocol, and wherein said user interface is further configured to receive a user input corresponding to said specific error checking protocol and to update at least one value within at least one compiler software object, wherein said at least one value to invokes a programming function to program said FPGA of said single reprogrammable telemetry card with said specific error checking protocol corresponding to said user input without altering said plurality of software radio defined objects so that said single reprogrammable telemetry card may be reused with other satellite telemetry systems, wherein said user interface is operatively coupled with a compiler to update an error checking protocol value in said at least one compiler software object wherein said updated error checking protocol value in said compiler software object invokes an updating function which updates said specific error checking protocol corresponding to said user input, wherein said plurality of software radio defined objects are not altered and remain useable within each of said plurality of non-uniform satellite telemetry systems.

2. The system of claim 1 wherein said list of satellite telemetry system types includes data structures for at least two satellite telemetry system types.

3. The system of claim 1 wherein said user-selected value is configured with data to perform Reed-Solomon error checking protocol.

4. The system of claim 1 wherein said user-selected value is configured with data to perform a PN generator error checking protocol.

5. The system of claim 1 wherein said specific error checking protocol is configured with data to perform a turbo code.

6. The system of claim 1 wherein said specific error checking protocol is configured with data to perform a Viterbi algorithm.

7. The system of claim 1 wherein said specific error checking protocol is configured with data to perform encryption.

8. The system of claim 1 wherein said specific error checking protocol is configured with data to perform auto-ranging.

9. The system of claim 1 wherein said specific error checking protocol is configured with data to perform BCH error-correcting protocol.

10. The system of claim 9 wherein said specific error checking protocol is configured with data to perform other versions of said BCH error-correcting protocol.

11. The system of claim 1 wherein said compiler is further configured with an FPGA with multiple error checking algorithms.

12. The system of claim 1, which further includes software which is CCSDS compatible with existing earth based ground stations.

13. A method for configuring at least one telemetry card consisting of:
- configuring a single reprogrammable telemetry card with a plurality of software defined radio components common to a plurality of non-uniform satellite telemetry systems;
- displaying a list of satellite telemetry system types, wherein each satellite telemetry system type corresponds to a specific error checking protocol;
- receiving a user input corresponding to said specific error checking protocol;
- invoking a programming function to program an FPGA of said single reprogrammable telemetry card with said specific error checking protocol corresponding to said user input, wherein said plurality of software radio defined objects are not altered and remain useable within each of said plurality of non-uniform satellite telemetry systems;
- utilizing a compiler to update at least one error checking protocol value within at least one compiler software object; and
- invoking an updating function which updates said specific error checking protocol corresponding to said user input, wherein said plurality of software radio defined objects are not altered and remain useable within each of said plurality of non-uniform satellite telemetry systems.

14. The method of claim 13 which further includes the step of programming said FPGA to perform Reed-Solomon error checking protocol.

15. The method of claim 13 which further includes the step of programming said FPGA to perform a PN generator error checking protocol.

16. The method of claim 13 which further includes the step of programming said FPGA to perform a turbo code algorithm.

17. The method of claim 13 which further includes the step of programming said FPGA to perform a Viterbi algorithm.

18. The method of claim 13 which further includes the step of programming said FPGA to perform encryption.

19. The method of claim 13 which further includes the step of programming said FPGA to perform auto-ranging.

20. The method of claim 13 which further includes the step of programming said FPGA to perform BCH error-correcting protocol.

21. The method of claim 20 which further includes the step of programming said FPGA to perform multiple alternative versions of said BCH error-correcting protocol.

* * * * *